United States Patent
Lee et al.

(10) Patent No.: US 9,269,918 B2
(45) Date of Patent: Feb. 23, 2016

(54) ORGANIC LIGHT-EMITTING DISPLAY DEVICE HAVING PLURAL EMITTING LAYERS DISPOSED BETWEEN TWO ELECTRODES

(71) Applicant: SAMSUNG DISPLAY CO., LTD., Yongin, Gyeonggi-Do (KR)

(72) Inventors: Chang Ho Lee, Yongin-si (KR); Jin Young Yun, Yongin-si (KR); Dae Yup Shin, Yongin-si (KR); Young Mok Son, Yongin-si (KR); Il Soo Oh, Yongin-si (KR); Hee Joo Ko, Yongin-si (KR); Se Jin Cho, Yongin-si (KR); Bo Ra Lee, Yongin-si (KR); Yeon Woo Lee, Yongin-si (KR); Pyung Eun Jeon, Yongin-si (KR); Hyun Ju Choi, Yongin-si (KR); Ji Hwan Yoon, Yongin-si (KR); Beom Joon Kim, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 135 days.

(21) Appl. No.: 14/065,985

(22) Filed: Oct. 29, 2013

(65) Prior Publication Data

US 2014/0353610 A1 Dec. 4, 2014

(30) Foreign Application Priority Data

May 29, 2013 (KR) ........................ 10-2013-0061054

(51) Int. Cl.
  *H01L 27/32* (2006.01)
  *H01L 51/50* (2006.01)
  *H01L 51/00* (2006.01)

(52) U.S. Cl.
  CPC .......... *H01L 51/504* (2013.01); *H01L 27/3211* (2013.01); *H01L 27/3218* (2013.01); *H01L 51/0013* (2013.01)

(58) Field of Classification Search
  CPC .................................................. H01L 27/3218
  See application file for complete search history.

(56) References Cited

U.S. PATENT DOCUMENTS

| | | | | |
|---|---|---|---|---|
| 2006/0232202 | A1* | 10/2006 | Matsuda et al. | 313/506 |
| 2011/0062475 | A1* | 3/2011 | Cho | 257/98 |
| 2012/0298968 | A1* | 11/2012 | Kim et al. | 257/40 |
| 2013/0113843 | A1* | 5/2013 | Yamazaki | 345/690 |

FOREIGN PATENT DOCUMENTS

| | | |
|---|---|---|
| KR | 1020050061410 | 6/2005 |
| KR | 1020070031914 | 3/2007 |
| KR | 1020080047777 | 5/2008 |

* cited by examiner

*Primary Examiner* — Stephen W Smoot
(74) *Attorney, Agent, or Firm* — F. Chau & Associates, LLC

(57) ABSTRACT

An organic light-emitting display device includes a substrate which includes a plurality of areas, a plurality of first electrodes disposed on the areas of the substrate, respectively, a second electrode disposed on the first electrodes, and a plurality of emitting layers disposed between the first electrodes and the second electrode. At least two of the emitting layers are disposed on all of the areas.

12 Claims, 11 Drawing Sheets

ORGANIC LIGHT-EMITTING DISPLAY DEVICE HAVING PLURAL EMITTING LAYERS DISPOSED BETWEEN TWO ELECTRODES

This application claims priority from Korean Patent Application No. 10-2013-0061054 filed on May 29, 2013, the disclosure of which is hereby incorporated herein by reference in its entirety.

TECHNICAL FIELD

The present disclosure relates to an organic light-emitting display device and a method of manufacturing the same.

DISCUSSION OF THE RELATED ART

Generally, an organic light-emitting display device includes a pixel electrode, a common electrode, and organic layers interposed between the pixel electrode and the common electrode. The organic layers include, for example, at least an emitting layer (EML) and may further include a hole injecting layer (HIL), a hole transport layer (HTL), an electron transport layer (ETL) and an electron injecting layer (EIL). In the organic light-emitting display device, holes and electrons generated by the pixel electrode and the common electrode may combine in an organic layer, such as, for example, in the emitting layer to form excitons. When an energy level of the excitons changes from an excited state to a ground state, the emitting layer may emit light of a color corresponding to the changed energy level.

To realize a full-color organic light-emitting display device, the above-mentioned organic layer should be pattern. To pattern the organic layer, a deposition method using a mask may be utilized. The deposition method using a mask is a conventional method that has been used and ensures high efficiency and stability.

Recently, the size of a pattern into which the organic layer is patterned has been reduced to obtain a high-resolution organic light-emitting display device. Accordingly, it has become difficult to manufacture a mask including an opening that corresponds to the pattern. Even if the mask can be manufactured, the opening of the mask may be clogged immediately after the initiation of a deposition process.

Therefore, a transfer method using a laser is being utilized to pattern the organic layer. With the transfer method using the laser, fine patterns can be formed relatively easily.

However, in the transfer method using the laser, heat generated from laser beams may directly affect a layer (e.g., the emitting layer) that is transferred, thereby reducing the life of the organic light-emitting display device. In particular, the life of the emitting layer which emits green light may be reduced the most significantly.

SUMMARY OF THE INVENTION

Exemplary embodiments of the present invention provide an organic light-emitting display device having an extended life, in which at least two of a plurality of emitting layers are commonly formed over the whole surface of a substrate.

Exemplary embodiments of the present invention also provide a method of manufacturing an organic light-emitting display device, in which at least two of a plurality of emitting layers are commonly formed over the whole surface of a substrate by a deposition process.

According to an exemplary embodiment of the present invention, there is provided an organic light-emitting display device including a substrate which includes a plurality of areas, a plurality of first electrodes disposed on the areas of the substrate, respectively, a second electrode disposed on the first electrodes, and a plurality of emitting layers disposed between the first electrodes and the second electrode. At least two of the emitting layers are disposed on all of the areas.

According to an exemplary embodiment of the present invention, there is provided an organic light-emitting display device including a substrate which includes a first area, a first electrode disposed on the first area of the substrate, a second electrode disposed on the first electrode, and a first auxiliary layer and a plurality of emitting layers located in the first area and disposed between the first electrode and the second electrode. The emitting layers include a first emitting layer disposed between the first auxiliary layer and the second electrode, a second emitting layer disposed between the first emitting layer and the second electrode, and a third emitting layer disposed between the first electrode and the first auxiliary layer.

According to an exemplary embodiment of the present invention, there is provided a method of manufacturing an organic light-emitting display device. The method includes forming a plurality of first electrodes on a plurality of areas of a substrate, respectively, forming a plurality of emitting layers and a plurality of auxiliary layers on the first electrodes, and forming a second electrode on the emitting layers and the auxiliary layers. At least two of the emitting layers are formed by a deposition process, and the auxiliary layers are formed by a transfer process.

According to an exemplary embodiment of the present invention, a method for manufacturing an organic light-emitting display device is provided. The method includes forming a plurality of first electrodes on a substrate including a first area, a second area and a third area, in which the first electrodes are formed on the first, second and third areas of the substrate using a deposition process, forming a first medium layer on the first electrodes in the first, second and third areas using a deposition process, aligning a mask having an opening over the first medium layer, performing a deposition process on the first medium layer by depositing an organic material through the opening in the mask using a deposition source facing a surface of the first medium layer, thereby forming a first emitting layer on the first medium layer in the first area, the second area and the third area, forming a first auxiliary layer and a second light emitting layer simultaneously on the first emitting layer in the first area by a transfer process using a first donor substrate, forming a second auxiliary layer on the first emitting layer in the second area by a transfer process using a second donor substrate and aligning a mask having an opening over the second emitting layer, the second auxiliary layer and the first emitting layer.

In addition, the method further includes performing a deposition process on the second emitting layer, the second auxiliary layer and the first emitting layer by depositing an organic material through the opening in the mask using a deposition source facing respective surfaces of the second emitting layer, the second auxiliary layer and the first emitting layer, thereby forming a third emitting layer in the first area, the second area and the third area and on the respective surfaces of the second emitting layer, the second auxiliary layer and the first emitting layer and sequentially stacking a second medium layer, a second electrode and a passivation layer on the third emitting layer using a deposition process.

BRIEF DESCRIPTION OF THE DRAWINGS

Exemplary embodiments of the present invention can be understood in more detail from the following detailed description taken in conjunction with reference to the attached drawings, in which.

DETAILED DESCRIPTION OF EXEMPLARY EMBODIMENTS OF THE INVENTION

Figure 1:
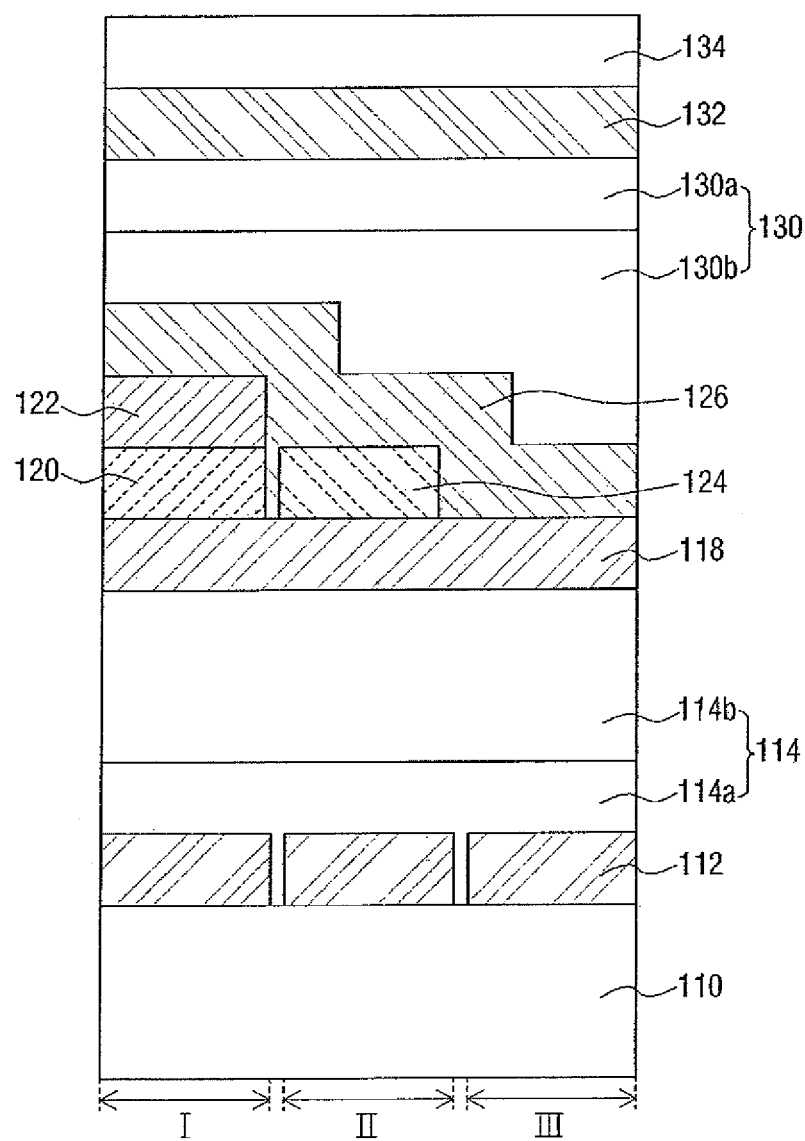
FIG. 1 is a schematic cross-sectional view of an organic light-emitting display device according to an embodiment of the present invention.

Exemplary embodiments of the present invention may, however, be embodied in many different forms and should not be construed as being limited to exemplary embodiments set forth herein. Like numbers refer to like elements throughout. In the drawings, the thickness of layers and regions may be exaggerated for clarity.

It will be understood that when an element or layer is referred to as being "on," or "connected to" another element or layer, it can be directly on or connected to the other element or layer or intervening elements or layers may be present. As used herein, the term "and/or" includes any and all combinations of one or more of the associated listed items. Also, as used herein, the singular forms "a," "an" and "the" are intended to include the plural forms as well, unless the context clearly indicates otherwise.

Hereinafter, embodiments of the present invention will be described with reference to the attached drawings.

FIG. 1 is a schematic cross-sectional view of an organic light-emitting display device 100 according to an embodiment of the present invention. Referring to FIG. 1, the organic light-emitting display device 100 according to the current embodiment may include, for example, a substrate 110, first electrodes 112, a first medium layer 114, a plurality of emitting layers (118, 122, 126), a plurality of auxiliary layers (120, 124), a second medium layer 130, a second electrode 132, and a passivation layer 134.

The substrate 110 may be, for example, an insulating substrate. The insulating substrate may be formed of a transparent glass material containing transparent $SiO_2$ as its main component. In an embodiment, the insulating substrate may be formed of for example, an opaque material or a plastic material. Also, in an exemplary embodiment, the insulation substrate 110, may be formed of, for example, ceramic or silicon materials. Further, the insulating substrate may be, for example, a flexible substrate that can be bent, folded or rolled. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

Although not shown in FIG. 1, the substrate 110 may further include other structures formed on the insulating substrate. Examples of the structures may include but are not limited to wirings, electrodes, and insulating layers. If the organic light-emitting display device 100 according to the current embodiment is an active-matrix organic light-emitting display device, the substrate 110 may include, for example, a plurality of thin-film transistors (TFTs) formed on the insulating substrate. Each of the TFTs may include, for example, a gate electrode, a source electrode, and a drain electrode, and a semiconductor layer which is a channel region. The semiconductor layer may be formed of, for example, amorphous silicon, microcrystalline silicon, polycrystalline silicon, or monocrystalline silicon. In an embodiment, the semiconductor layer may, alternatively be formed of, for example, an oxide semiconductor. The drain electrodes of at least some of the TFTs may be electrically connected to the first electrodes 112.

For example, the source and the drain electrodes may include metal, alloy, metal nitride, conductive metal oxide and/or a transparent conductive material. The source and drain electrodes may include, for example, aluminum, alloy including aluminum, aluminum nitride (AlNx), silver (Ag), alloy including silver, tungsten (W), tungsten nitride (WNx), copper (Cu), alloy including copper, nickel (Ni), chrome (Cr), chrome nitride (CrOx), molybdenum (Mo), alloys including molybdenum, titanium, titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), and the like. These may be used alone or in a combination thereof. Each of the source and the drain electrodes may have a single-layered structure or a multi-layered structure.

The substrate 110 may include, for example, a plurality of areas (I, II, III). The areas (I, II, III) of the substrate 110 may be separated from each other by a predetermined distance. The areas (I, II, III) may be where a plurality of pixels are located. In an exemplary embodiment, the areas (I, II, III) may include a first area I, a second area II, and a third area III. The first area I, the second area II, and the third area III may emit, for example, red light, green light, and blue light, respectively. In an exemplary embodiment, the areas (I, II, III) may additionally include, for example, a fourth area (not shown). The fourth area may emit, for example, white light.

The first electrodes 112 are formed on the substrate 110. The first electrodes 112 may be located on the areas (I, II, III) of the substrate 110, respectively. That is, the first electrodes 112 may respectively be formed in the pixels to be separated from each other. In an exemplary embodiment, the first electrodes 112 may be disposed on, for example, all of the first area I, the second area II, and the third area III of the substrate 110. The first electrodes 112 may be formed on the substrate 110 to directly contact the substrate 110, or a material such as an insulating layer may be interposed between the first electrodes 112 and the substrate 110.

The first electrodes 112 may be, for example, anodes or cathodes. If the first electrodes 112 are anodes, the second electrode 132 may be a cathode. Thus, embodiments of the present invention will be described below based on this assumption. However, alternatively, in an embodiment, the first electrodes 112 may also be cathodes, and the second electrode 132 may also be an anode.

To be used as anodes, the first electrodes 112 may be formed of, for example, a conductive material with a high work function. If the organic light-emitting display device 100 is of a bottom emission type, the first electrodes 112 may be formed of, for example, a material such as indium tin oxide (ITO), indium zinc oxide (IZO), zinc oxide (ZnO) or $In_2O_3$ or may be formed of a stacked layer of these materials. If the organic light-emitting display device 100 is of a top emission type, the first electrodes 112 may further include, for example, a reflective layer formed of silver (Ag), magnesium (Mg), aluminum (Al), platinum (Pt), palladium (Pd), gold (Au), nickel (Ni), neodymium (Nd), iridium (Ir), chromium (Cr), lithium (Li) or calcium (Ca). The first electrodes 112 can be modified in various ways to have, for example, a structure composed of two or more layers formed using two or more different materials selected from the above materials.

The first electrodes 112 may have a thickness of, for example, about 500 to about 1500 Å. For example, in an embodiment, the first electrodes 112 may have a thickness of approximately 1000 Å.

Although not shown in FIG. 1, a pixel defining layer may, for example, be interposed between the first electrodes 112 of different pixels to divide the pixels. For example, the pixel defining layer may be formed on the substrate 110 and include openings that expose regions in which the first electrodes 112 of the pixels are to be formed, respectively. The pixel defining layer may be formed of, for example, at least one organic material selected from benzocyclobutene (BCB), polyimide (PI), polyamide (PA), acrylic resin, phenolic resin, siloxane-based resin, resin containing photosensitive acryl carboxyl group, novolac resin, alkali-soluble resin or may be formed of an inorganic material such as silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, and the like.

The first medium layer 114 may be formed on the first electrodes 112. The first medium layer 114 may help the injection or transportation of electrons or holes between the first electrodes 112 and the second electrode 132. If the first electrodes 112 are anodes, the first medium layer 114 may be a layer related to the injection or transportation of holes.

The first medium layer 114 may be, for example, divided into a plurality of sections corresponding respectively to the pixels. Alternatively, the first medium layer 114 may be formed as, for example, a single piece over the whole surface of the substrate 110, as shown in FIG. 1. That is, the first medium layer 114 may be formed as a common layer regardless of the division between the pixels. In other words, the first medium layer 114 may be formed commonly to the areas (I, II, III). In an embodiment, the first medium layer 114 may also be omitted.

The first medium layer 114 may include, for example, a hole injecting layer 114a and/or a hole transport layer 114b. In an exemplary embodiment, the first medium layer 114 may include, for example, the hole injecting layer 114a or the hole transport layer 114b alone. In an exemplary embodiment, the first medium layer 114 may alternatively include, for example, a stack of the hole injecting layer 114a and the hole transport layer 114b.

The hole injecting layer 114a may be disposed on the first electrodes 112. The material that forms the hole injecting layer 114a may be selected from known hole injection materials including, but not limited to, a phthalocyanine compound such as copper phthalocyanine, a starburst-type amine derivative such as TCTA or m-MTDATA, a conductive polymer such as polyaniline/dodecylbenzenesulfonic acid (Pani/DBSA), poly(3,4-ethylenedioxythiophene/poly(4-styrene-sulfonate (PEDOT/PSS), polyaniline/camphor sulfonic acid (Pani/CSA) or polyaniline/poly(4-styrene-sulfonate)(PANI/PSS).

The hole transport layer 114b may be disposed on the hole injecting layer 114a. The material that forms the hole transport layer 114b may be selected from known hole transport materials including, but not limited to, 1,3,5-tricarbazolyl benzene, 4,4'-biscarbazolylbiphenyl, polyvinylcarbazole, m-biscarbazolylphenyl, 4,4'-biscarbazolyl-2,2-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)-siiane, N,N'-bis(3-methylphenyl)-N,N-diphenyl-[1,1-biphenyl]-4,4'-diamine (TPD), N,N-di(naphtalene-1-yl)-N,N'-diphenyl benzidine (NPD), N,N-diphenyl-N,N'-bis(1-naphtyl)-(1,1'-biphenyl)-4,4'-diamine (NPB), poly(9,9-dioctylfluorene-co-N-(4-butylphenyl)diphenylamine) (TFB), and poly(9,9-dioctylfluorene-co-bis-(4-butylphenyl-bis-N,N-phenyl-1,4-phenylenediamin (PFB). The hole transport layer 114b may be formed to a thickness of 700 to 1700 Å. In a preferred embodiment, the hole transport layer 114b may be formed to a thickness of 1200 Å.

The hole injecting layer 114a or the hole transport layer 114b may be formed using various methods including, for example, vacuum deposition, spin coating, casting, and LB methods. For example, in an embodiment the vacuum deposition method may be used. When the hole injecting layer 114a or the hole transport layer 114b is formed by the vacuum deposition method, its deposition conditions may vary according to, for example, a compound used as the material that forms the hole injecting layer 114a or the hole transport layer 114b and the intended structure and thermal characteristics of the hole injecting layer 114a or the hole transport layer 1141). However, the deposition conditions of the hole injecting layer 114a or the hole transport layer 114b may generally include, for example, a deposition temperature ranging from about 100 to about 500° C., a vacuum level ranging from about $10^{-8}$ to about $10^{-3}$ torr, and a deposition rate ranging from about 0.01 to about 100 Å/sec.

The emitting layers (118, 122, 126) may be formed on the first medium layer 114. Each of the emitting layers (118, 122, 126) may emit light of a certain color. For example, holes and electrons generated by the first electrodes 112 and the second electrode 132 may combine in each of the emitting layers (118, 122, 126) to form excitons. When an energy level of the excitons changes from an excited state to a ground state, each of the emitting layers (118, 122, 126) may emit light of a color corresponding to, for example, the changed energy level. In an exemplary embodiment, the emitting layers (118, 122, 126) may emit, for example, red light, green light, and blue light. In an exemplary embodiment, the emitting layers (118, 122, 126) may emit, for example, white light in addition to the red light, the green light and the blue light.

At least two of the emitting layers (118, 122, 126) may be formed, for example, as single pieces over the whole surface of the substrate 110. That is, at least two of the emitting layers (118, 122, 126) may be formed as common layers regardless of the division between the pixels. In other words, at least two of the emitting layers (118, 122, 126) may be formed commonly to the areas (I, II, III) (I, II, III).

The emitting layers (118, 122, 126) may include, for example, a first emitting layer 122, a second emitting layer 126, and a third emitting layer 118. For example, in an exemplary embodiment, the first emitting layer 122 may emit red light, the second emitting layer 126 may emit green light, and the third emitting layer 118 may emit blue light. The present exemplary embodiment of the present invention will be described below based on this assumption but is not limited thereto.

The first emitting layer 122 may be disposed, for example, in the first area I. For example, the first emitting layer 122 may exist only in the first area I. That is, the first emitting layer 122 may not exist in the second area II and the third area III. In addition, the first emitting layer 122 may be, for example, interposed between the second emitting layer 126 and the third emitting layer 118.

The first emitting layer 122 may be formed by, for example, a transfer process. Here, the transfer process may be, but is not limited to, a laser induced thermal imaging (LITI) process. In an exemplary embodiment, the first emitting layer 122 may be formed, for example, at the same time as a first auxiliary layer 120, which will be described later, by a transfer process.

The first emitting layer 122 may be formed of, for example, a polymer material or a small molecule organic material which uniquely emits red light or a mixture of the polymer material and the small molecule organic material. In an embodiment, the first emitting layer 122 may include, for example, a red host material and a red dopant material.

The red host material of the first emitting layer 122 may include, but not limited to, one or more materials selected from the group consisting of bis(2-(2-hydroxyphenyl)benzothiazolato)zinc (Zn(BTZ)2) and bis-(2-methyl-8-quinolinolate)-4-(phenylphenolate)aluminum. The red dopant material of the first emitting layer 122 may be, but is not limited to, PtOEP, Ir(piq)$_3$, Btp$_2$Ir(acac), DCJTB, etc.

The second emitting layer 126 may be disposed, for example, in all of the areas (I, II, III). That is, the second emitting layer 126 may be disposed in all of the first area I, the second area II, and the third area III. In an exemplary embodiment, the second emitting layer 126 may be formed as, for example, a single piece over the whole surface of the substrate. That is, the second emitting layer 126 may be formed as a common layer regardless of the division between the pixels. In other words, the second emitting layer 126 may be formed commonly to the areas (I, II, III). That is, the second emitting layer 126 may not only be formed in the first area I but also extend to the second area II and the third area III, thereby overlapping the first emitting layer 122 and the third emitting layer 118.

The second emitting layer 126 may be, for example, interposed between the first emitting layer 122 and the second electrode 132. For example, the second emitting layer 126 may be interposed between the third emitting layer 118 and the second medium layer 130.

The second emitting layer 126 may be formed by, for example, a deposition process. Here, the deposition process may be, but is not limited to, a vacuum deposition process using an open mask.

The second emitting layer 126 may be formed of, for example, a polymer material or a small molecule organic material which uniquely emits green light or a mixture of the polymer material and the small molecule organic material. In an embodiment, the second emitting layer 126 may include, for example, a green host material and a green dopant material.

The green host material of the second emitting layer 126 may include one or more materials selected from, but not limited to, an anthracene derivative and a carbazole compound. The anthracene derivative may be, for example, 9,10-(2-dinaphthyl) anthracene (ADN), and the carbazole compound may be 4,4'-(carbazole-9-yl)biphenyl (CBP). The green dopant material of the second emitting layer 126 may be, but is not limited to, Ir(ppy)$_3$ (ppy=phenylpyridine), Ir(ppy)$_2$(acac), Ir(mpyp)$_3$, or C545T.

The second emitting layer 126 may, for example, not only emit light but also transport electrons. That is, the second emitting layer 126 mostly emits light in the second area II but may transport electrons to the first emitting layer 122 and the third emitting layer 118 in the first area I and the third area III.

The third emitting layer 118 may be disposed, for example, in all of the areas (I, II, III). That is, the third emitting layer 118 may be disposed in all of the first area I, the second area II, and the third area III. In an exemplary embodiment, the third emitting layer 118 may be formed, for example, as a single piece over the whole surface of the substrate 110. That is, the third emitting layer 118 may be formed as a common layer regardless of the division between the pixels. In other words, the third emitting layer 118 may be formed commonly to the areas (I, II, III). That is, the third emitting layer 118 may not only be formed in the first area I but also extend to the second area II and the third area III, thereby overlapping the first emitting layer 122 and the second emitting layer 126.

The third emitting layer 118 may be, for example, interposed between the first emitting layer 122 and the first electrodes 112. For example, the third emitting layer 118 may be interposed between the first medium layer 114 and the second emitting layer 126. In an exemplary embodiment, the first emitting layer 122 and the second emitting layer 126 may be formed, for example, on the third emitting layer 118.

The third emitting layer 118 may be formed by, for example, a deposition process. Here, the deposition process may be, but is not limited to, a vacuum deposition process using an open mask.

The third emitting layer 118 may be formed of, for example, a polymer material or a small molecule organic material which uniquely emits blue light or a mixture of the polymer material and the small molecule organic material. In an embodiment, the third emitting layer 118 may include, for example, a blue host material and a blue dopant material.

The blue host material of the third emitting layer 118 may include one or more materials selected from, but not limited to, an anthracene derivative and a carbazole compound. The anthracene derivative may be, for example, 9,10-(2-dinaphthyl) anthracene (ADN), and the carbazole compound may be 4,4'-(carbazole-9-yl)biphenyl (CBP). The blue dopant material of the third emitting layer 118 may be, but is not limited to, F$_2$Irpic, (F$_2$ppy)$_2$Ir(tmd), Ir(dfppz)$_3$, ter-fluorene, etc.

The third emitting layer 118 may, for example, not only emit light but also transport holes. That is, the third emitting layer 118 mostly emits light in the third area III but may transport holes to the first emitting layer 122 and the second emitting layer 126 in the first area I and the second area II.

The auxiliary layers (120, 124) may be formed, for example, on the first medium layer 114. For example, the auxiliary layers (120, 124) may be interposed between the second emitting layer 126 and the third emitting layer 118. The auxiliary layers (120, 124) may control the resonance cycle of light emitted from the emitting layers (118, 122, 126). To increase the color purity, luminance efficiency, etc. of light emitted from the emitting layers (118, 122, 126), the auxiliary layers (120, 124) may be formed to a predetermined thickness. The auxiliary layers (120, 124) may be formed of, for example, the same material as the hole transport layer 114b. In an exemplary embodiment, each of the auxiliary layers (120, 124) may be formed to, for example, a thickness of about 300 to about 1500 Å.

The auxiliary layers (120, 124) may include, for example, the first auxiliary layer 120 and a second auxiliary layer 124.

The first auxiliary layer 120 may be disposed, for example, in the first area I. For example, the first auxiliary layer 120 may exist only in the first area I. That is, the first auxiliary layer 120 may not exist in the second area II and the third area III. In addition, the first auxiliary layer 120 may be, for example, interposed between the first emitting layer 122 and the third emitting layer 118. The first auxiliary layer 120 may be formed by, for example, a transfer process. Here, the transfer process may be, but is not limited to, an LITI process. In an exemplary embodiment, the first auxiliary layer 120 may be formed, for example, at the same time as the first emitting layer 122 by a transfer process.

The first auxiliary layer 120 may be formed to a predetermined thickness to control the resonance cycle of light emitted from the first emitting layer 122. To increase the luminous efficiency, color purity, etc. of light emitted from the first emitting layer 122, the thickness of the first auxiliary layer 120 may be set in a range of, for example, about 500 to about 1800 Å. For example, in an embodiment, the first auxiliary layer 120 may be formed to, for example, a thickness of approximately 900 Å. In an exemplary embodiment, the first auxiliary layer 120 may be, for example, thicker than the second auxiliary layer 124. The material that forms the first auxiliary layer 120 may be, but is not limited to, identical to the material that forms the hole transport layer 114b. In an exemplary embodiment, the first auxiliary layer 120 may include, for example, at least one material selected from silicon nitride ($SiN_x$), silicon oxide ($SiO_2$), and silicon oxynitride ($SiO_N$).

The second auxiliary layer 124 may be disposed, for example, in the second area II. For example, the second auxiliary layer 124 may exist only in the second area II. That is, the second auxiliary layer 124 may not exist in the first area I and the third area III. In addition, the second auxiliary layer 124 may be, for example, interposed between the second emitting layer 126 and the third emitting layer 118. The second auxiliary layer 124 may be formed by, for example, a transfer process. Here, the transfer process may be, but is not limited to, an LITI process. In an exemplary embodiment, the second auxiliary layer 124 may be formed, for example, alone by a transfer process.

The second auxiliary layer 124 may be formed to a predetermined thickness to control the resonance cycle of light emitted from the second emitting layer 126. To increase the luminous efficiency, color purity, etc. of light emitted from the second emitting layer 126, the thickness of the second auxiliary layer 124 may be set in a range of, for example, about 300 to about 1500 Å. For example, in an embodiment, the second auxiliary layer 124 may be formed to a thickness of approximately 700 Å. The material that forms the second auxiliary layer 124 may be, but is not limited to, identical to the material that forms the hole transport layer 114b. In an exemplary embodiment, the second auxiliary layer 124 may include, for example, at least one material selected from silicon nitride ($SiN_x$), silicon oxide ($SiO_2$), and silicon oxynitride ($SiO_N$).

For example, the structures of the emitting layers (118, 122, 126) and the auxiliary layers (120, 124) can be summarized as follows. In the first area I, the third emitting layer 118, the first auxiliary layer 120, the first emitting layer 122, and the second emitting layer 126 may be stacked sequentially on the first medium layer 114. In the second area II, the third emitting layer 118, the second auxiliary layer 124, and the second emitting layer 126 may be stacked sequentially on the first auxiliary layer 114. In the third area III, the third emitting layer 118 and the second emitting layer 126 may be stacked sequentially on the first medium layer 114. In addition, the second emitting layer 126 and the third emitting layer 118 may be formed by a deposition process, and the first emitting layer 122, the first auxiliary layer 120 and the second auxiliary layer 124 may be formed by a transfer process. Also, the second emitting layer 126 and the third emitting layer 118 may be formed over the whole surface of the substrate 110. The first emitting layer 122 and the first auxiliary layer 120 may be formed only in the first area I, and the second auxiliary layer 124 may be formed only in the second area II. Further, the first emitting layer 122, the first auxiliary layer 120, and the second auxiliary layer 124 may be surrounded by the second emitting layer 126 and the third emitting layer 118.

For example, the light emission mechanism of the emitting layers (118, 122, 126) and the auxiliary layers (120, 124) can be summarized as follows.

Referring to the first area I, holes generated by the first electrodes 112 may reach the first emitting layer 122 via the third emitting layer 118 and the first auxiliary layer 120 having a hole transport capability. In addition, electrons generated by the second electrode 132 may reach the first emitting layer 122 via the second emitting layer 126 having an electron transport capability. The holes and the electrons reaching the first emitting layer 122 may form excitons. When an energy level of the excitons changes from an excited state to a ground state, the first emitting layer 122 may emit red light. Here, due to the first auxiliary layer 120, all of the holes generated by the first electrodes 112 can reach the first emitting layer 122, and the electrons generated by the second electrode 132 may not reach the third emitting layer 118. Therefore, the third emitting layer 118 may not be able to emit light. However, the second emitting layer 126 may emit some green light although it mostly functions as an electron transport layer 130b in the first area I. That is, about 70 to about 80% of red light is emitted from the first emitting layer 122, and about 20 to about 30% of green light is emitted from the second emitting layer 126. Light emitted from the first emitting layer 122 and the second emitting layer 126 is filtered as it resonates in the first area I. Finally, only red light is emitted out of the organic light-emitting display device 100 in the first area I.

Referring to the second area II, holes generated by the first electrodes 112 may reach the second emitting layer 126 via the third emitting layer 118 and the second auxiliary layer 124 having a hole transport capability. In addition, electrons generated by the second electrode 132 may reach the second emitting layer 126 via the second medium layer 130. The holes and the electrons reaching the second emitting layer 126 may form excitons. When an energy level of the excitons changes from an excited state to a ground state, the second emitting layer 126 may emit green light. Here, due to the second auxiliary layer 124, all of the holes generated by the first electrodes 112 can reach the second emitting layer 126, and the electrons generated by the second electrode 132 cannot reach the third emitting layer 118. Therefore, the third emitting layer 118 may not be able to emit light. That is, about 100% of green light may be emitted from the second emitting layer 126. The green light emitted from the second emitting layer 126 resonates in the first area I. Thus, the green light with increased color purity is emitted out of the organic light-emitting display device 100.

Referring to the third area III, holes generated by the first electrodes 112 may reach the third emitting layer 118 via the first medium layer 114 having a hole transport capability. In addition, electrons generated by the second electrode 132 may reach the third emitting layer 118 via the second emitting layer 126 having an electron transport capability. The holes and the electrons reaching the third emitting layer 118 may form excitons. When an energy level of the excitons changes from an excited state to a ground state, the third emitting layer 118 may emit blue light. Here, the second emitting layer 126 may emit some green light although it mostly functions as the electron transport layer 130b in the third area III. That is, about 70 to about 80% of blue light is emitted from the third emitting layer 118, and about 20 to about 30% of blue light is emitted from the second emitting layer 126. Light emitted from the third emitting layer 118 and the second emitting layer 126 is filtered as it resonates in the third area III. Finally, only blue light is emitted out of the organic light-emitting display device 100 in the third area III.

The second medium layer 130 may be formed, for example, on the second emitting layer 126. The second medium layer 130 may help the injection or transportation of electrons or holes between the first electrodes 112 and the second electrode 132. If the second electrode 132 is a cathode, the second medium layer 130 may be, for example, a layer related to the injection or transportation of electrons.

The second medium layer 130 may extend, for example, onto side and top surfaces of the pixel defining layer. The second medium layer 130 may be, for example, divided into a plurality of sections corresponding respectively to the pixels. Alternatively, the second medium layer 130 may be formed, for example, as a single piece over the whole surface of the substrate 110, as shown in FIG. 1. That is, the second medium layer 130 may be formed as a common layer regardless of the division between the pixels. In other words, the second medium layer 130 may be formed commonly to the areas (I, II, III). In an embodiment, the second medium layer 130 may be omitted.

The second medium layer 130 may include, for example, the electron transport layer 1301) and/or an electron injecting layer 130a. In an exemplary embodiment, the second medium layer 130 may include, for example, only one of the electron transport layer 130b or the electron injecting layer 130a. In an exemplary embodiment, the second medium layer 130 may alternatively, include, for example, a stack of the electron transport layer 130b and the electron injecting layer 130a.

The electron transport layer 130b may be disposed, for example, on the second emitting layer 126. The material that forms the electron transport layer 130b may be, for example, a material that can stably transport electrons injected from an electron injection electrode (cathode). The material may be a known material such as a quinoline derivative, including, but not limited to, tris(8-quinolinorate)aluminum ($Alq_3$), 3-(4-biphenylyl)-4-phenyl-5-(4-tert-butyl phenyl)-1,2,4-triazole (TAZ), 2-(4-biphenylyl)-5-(tert.-butylphenyl)-1,3,4-oxadiazole (butyl-PBD), 2-(4-biphenylyl)-5-phenyl-1,3,4-oxadiazole (PBD), Balq, etc. The electron transport layer 130b may have a thickness of 200 to 400 Å. For example, in an embodiment, the electron transport layer 130b may have a thickness of approximately 300 Å.

The electron injecting layer 130a may be disposed, for example, on the electron transport layer 130b. The electron injecting layer 130a may be formed of a known material such as, but not limited to, lithium fluoride (LiF), sodium chloride (NaCl), cesium fluoride (CsF), lithium oxide ($Li_2O$), barium oxide (BaO), etc. The electron injecting layer 130a may have a thickness of, for example, about 10 to about 15 Å. For example, in a preferred embodiment, the electron injecting layer 130a may have a thickness of approximately 13 Å.

The electron transport layer 130b or the electron injecting layer 130a may be formed using various methods including, for example, vacuum deposition and spin coating. When the electron transport layer 130b or the electron injecting layer 130a is formed using vacuum deposition or spin coating, the deposition or coating conditions may vary according to, for example, a compound used but are generally almost the same as those for the formation of the hole injecting layer 114a.

The second electrode 132 may be formed on, for example, the second medium layer 130. The second electrode 132 used as a cathode may be formed of, for example, a conductive material with a low work function. The second electrode 132 may be formed of, for example, silver (Ag), magnesium (Mg), aluminum (Al), platinum (Pt), palladium (Pd), gold (Au), nickel (Ni), neodymium (Nd), iridium (Ir), chromium (Cr), lithium (Li) or calcium (Ca). The second electrode 132 may have a thickness of, for example, about 50 to about 150 Å. In an embodiment, the second electrode 132 may have, for example, a thickness of approximately 100 Å.

The passivation layer 134 may be disposed, for example, on the second electrode 132. The passivation layer 134 may protect stacked layers thereunder. The passivation layer 134 may be formed of, for example, an insulating material. For example, the passivation layer 134 may contain, an inorganic insulator such as silicon nitride (SiNx) and silicon oxide (SiOx) or an organic insulator. For example, the organic insulator of the second passivation layer 134 may include benzocyclobutene (BCB), acryl-based resin or a combination thereof.

A spacer (not shown) may be disposed, for example, between the second electrode 132 and the passivation layer 134. The passivation layer 134 may have a thickness of 400 to 800 Å. In a preferred embodiment, the passivation layer 134 may have, for example, a thickness of approximately 600 Å. Alternatively, in an embodiment of the present invention, the passivation layer 134 may be omitted. In this case, an encapsulation layer formed of, for example, an insulating material may cover the entire structure to protect the structure.

For example, to manufacture a high-resolution organic light-emitting display device, a transfer process, for example, an LITI process should be used. However, in a transfer process using laser beams 600, heat generated from the laser beams 600 may directly affect a layer that is transferred, thereby reducing the life of an organic light-emitting display device. In particular, the life of an emitting layer which emits green light may reduced most significantly.

According to the current embodiment, a transfer process is used in the manufacture of the organic light-emitting display device 100 to obtain the high-resolution organic light-emitting display device 100. However, as only the first emitting layer 122 and the auxiliary layers (120, 124) are formed by a transfer process, a reduction in the life of the organic light-emitting display device 100 can be minimized. In particular, a reduction in the life of the second emitting layer 126 which emits green light can be prevented by forming the second emitting layer 126 which emits green light using, for example, a deposition process.

Furthermore, the emitting layers (118, 122, 126) and the auxiliary layers (120, 124) are formed using a donor substrate and an open mask, and not a fine metal mask (FMM). Therefore, process efficiency can be increased.

Figure 2:
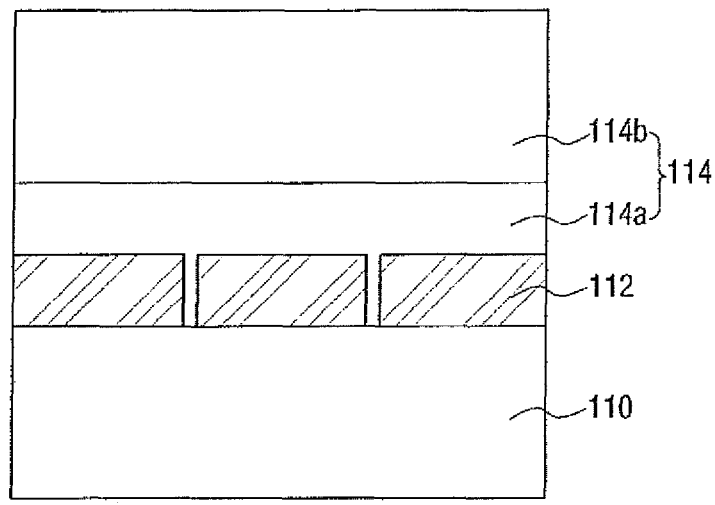
FIG. 2 is a cross-sectional view illustrating an operation of forming a stacked structure of a substrate, first electrodes, and a first medium layer in a method of manufacturing the organic light-emitting display device of FIG. 1.
Figure 3:
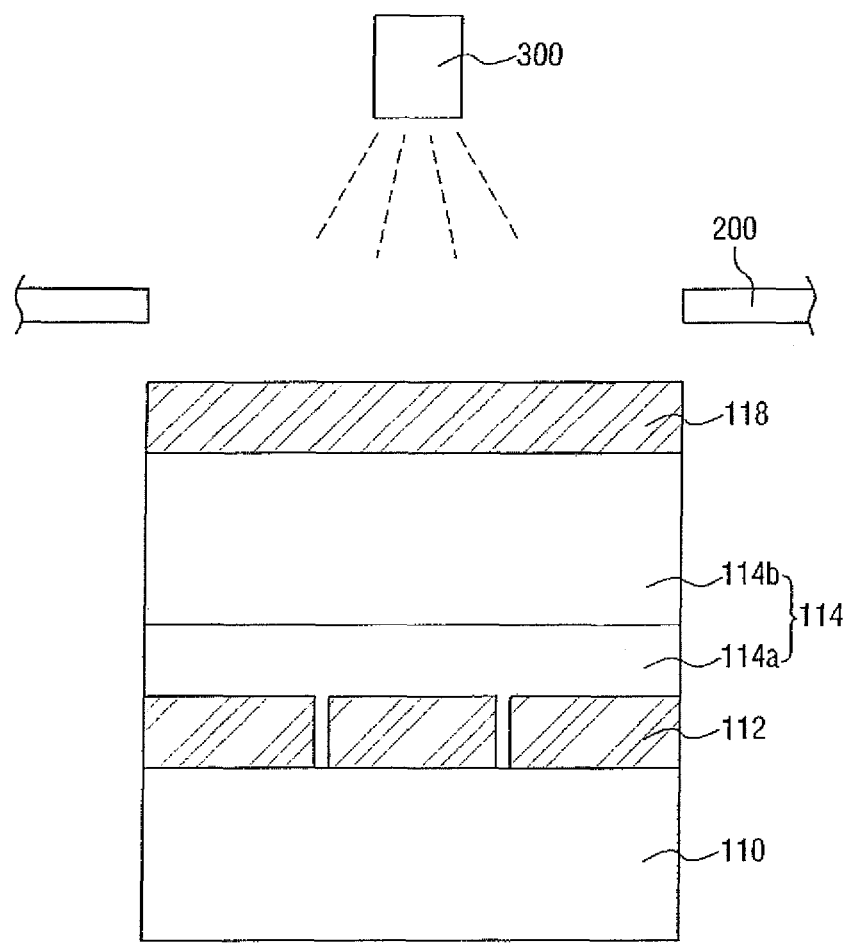
FIG. 3 is a cross-sectional view illustrating an operation of forming a third emitting layer on the stacked structure in the method of manufacturing the organic light-emitting display device of FIG. 1.
Figure 4:
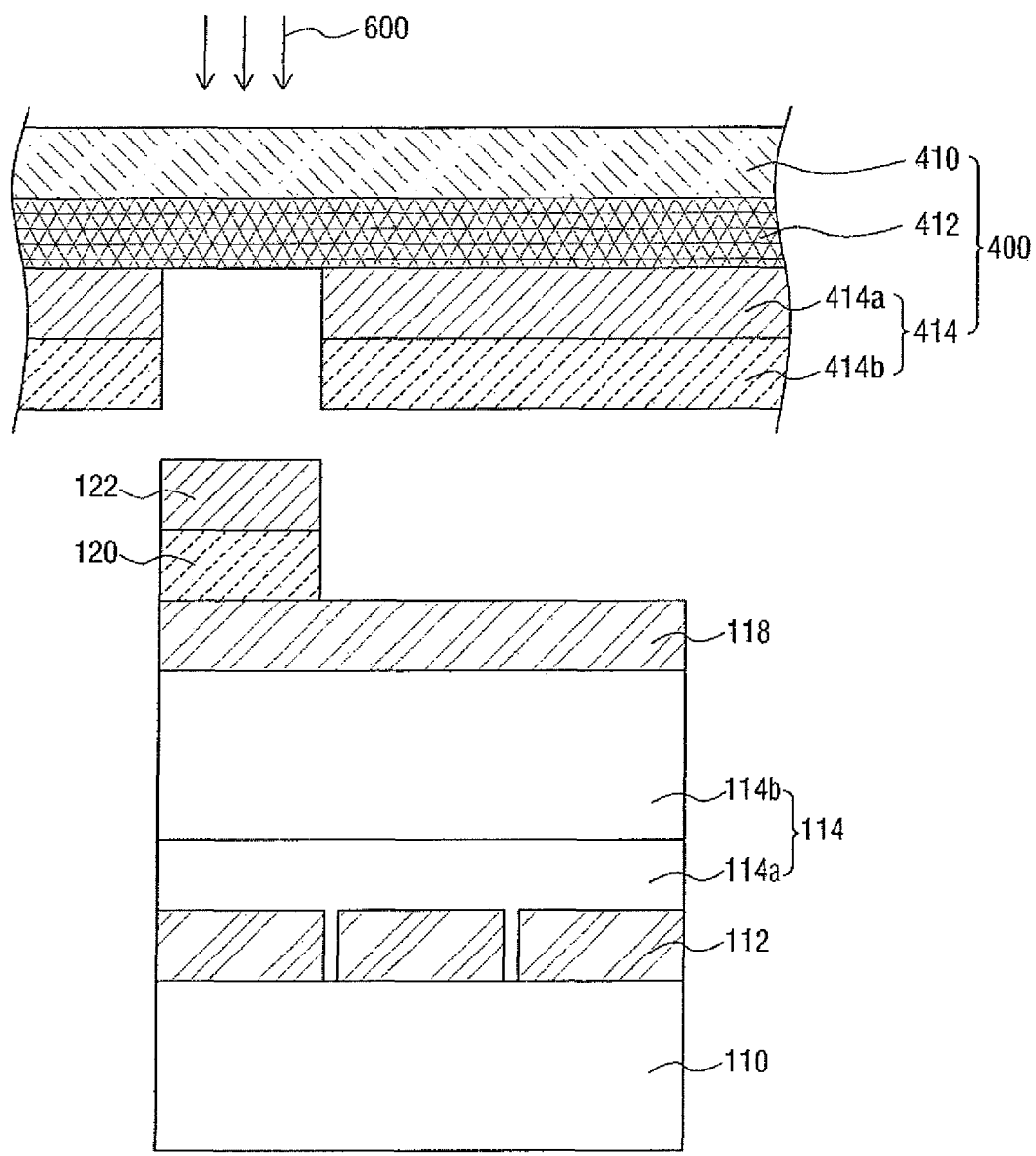
FIG. 4 is a cross-sectional view illustrating an operation of forming a first auxiliary layer and a first emitting layer on the third emitting layer in the method of manufacturing the organic light-emitting display device of FIG. 1.
Figure 5:
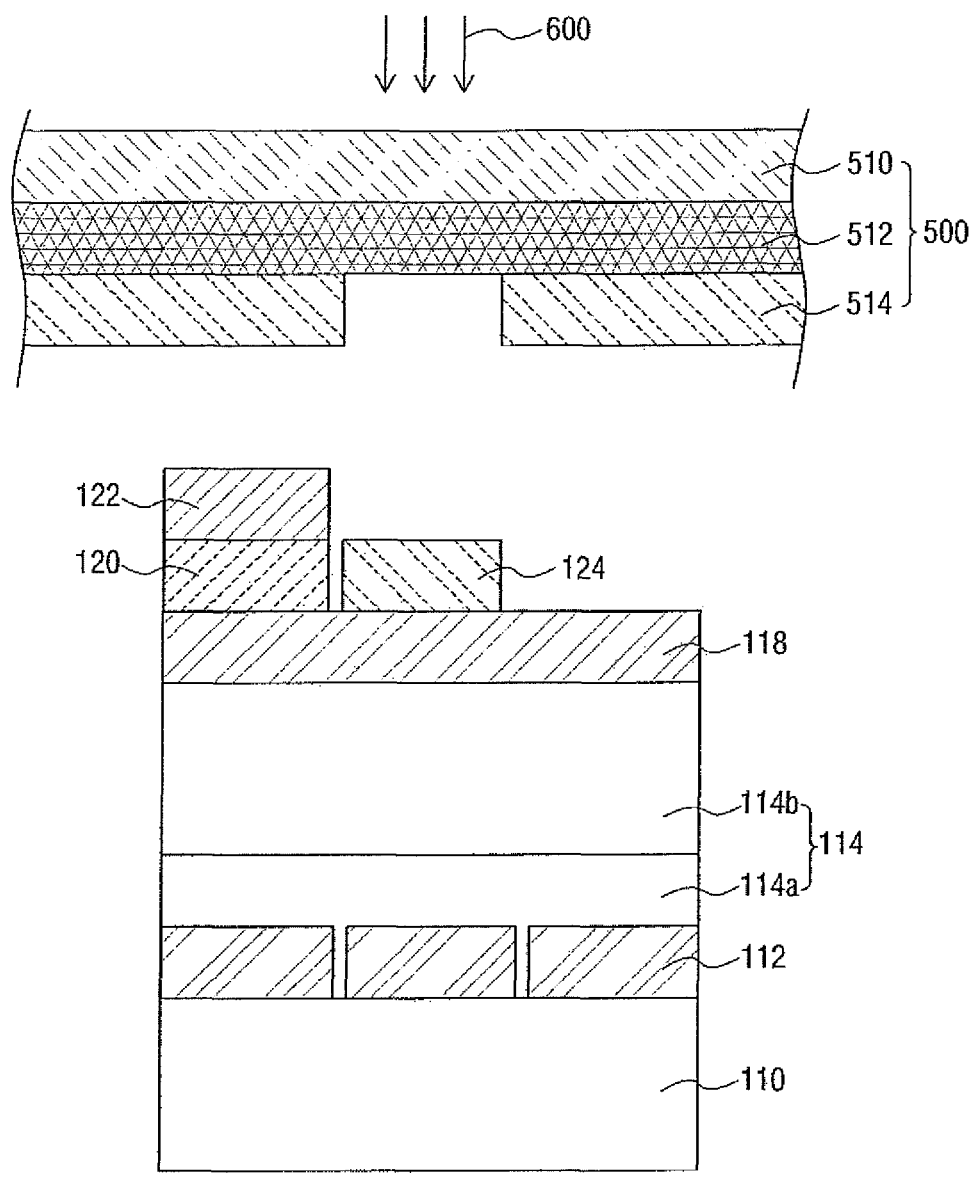
FIG. 5 is a cross-sectional view illustrating an operation of forming a second auxiliary layer on the third emitting layer in the method of manufacturing the organic light-emitting display device of FIG. 1.
Figure 6:
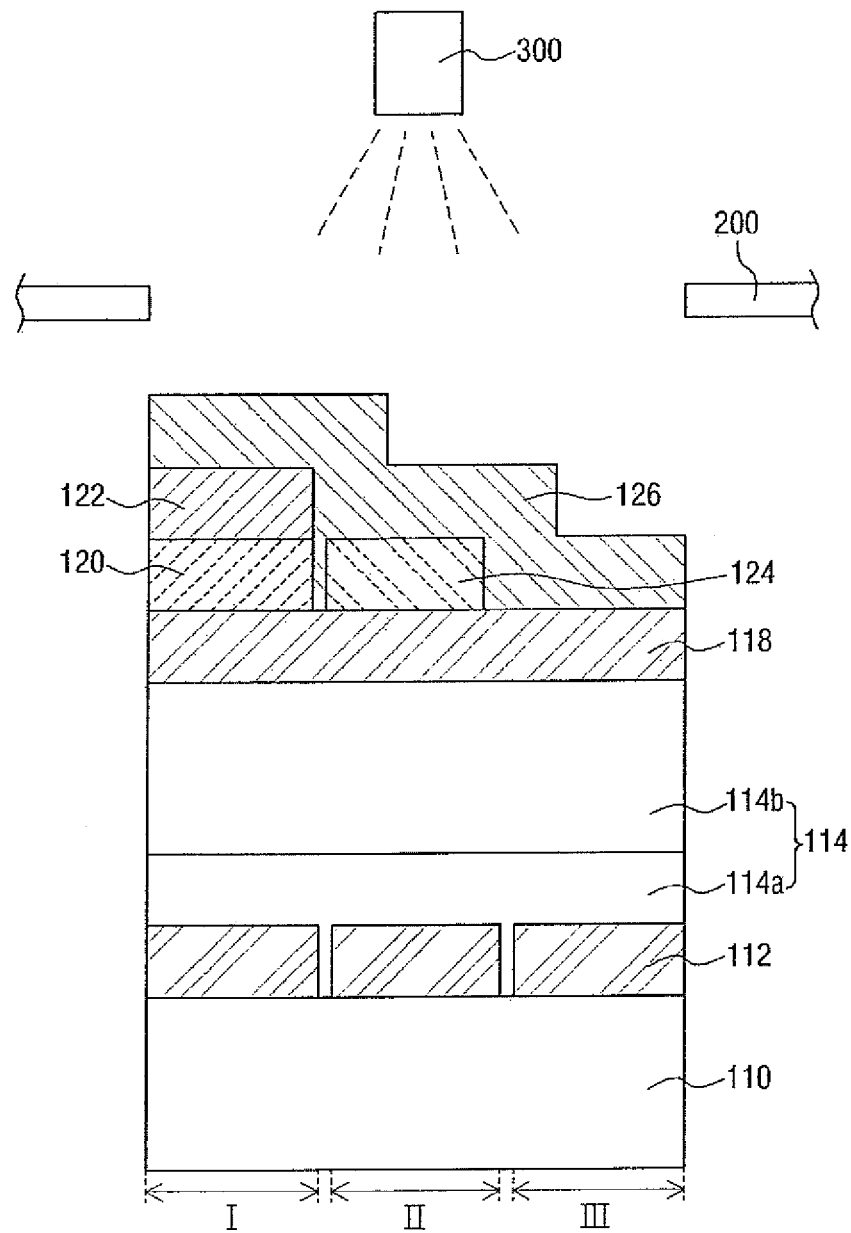
FIG. 6 is a cross-sectional view illustrating an operation of forming a second emitting layer on the third emitting layer in the method of manufacturing the organic light-emitting display device of FIG. 1.
Figure 7:
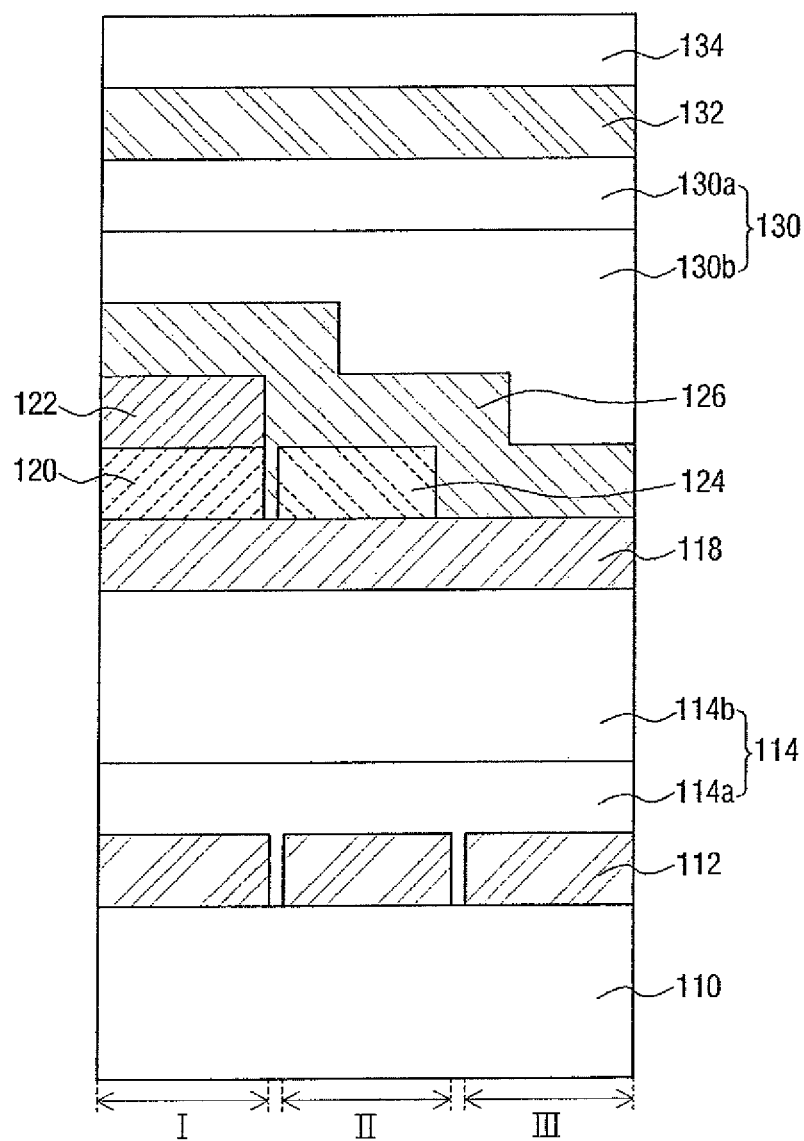
FIG. 7 is a cross-sectional view illustrating an operation of forming a second medium layer, a second electrode, and a passivation layer on the second emitting layer in the method of manufacturing the organic light-emitting display device of FIG. 1.

A method of manufacturing the organic light-emitting display device 100 according to an embodiment of the present invention will now be described with reference to FIGS. 2 through 7. FIG. 2 is a cross-sectional view illustrating an operation of forming a stacked structure of a substrate 110, first electrodes 112, and a first medium layer 114 in a method of manufacturing the organic light-emitting display device 100 of FIG. 1. FIG. 3 is a cross-sectional view illustrating an operation of forming a third emitting layer 118 on the stacked structure in the method of manufacturing the organic light-emitting display device 100 of FIG. 1. FIG. 4 is a cross-sectional view illustrating an operation of forming a first auxiliary layer 120 and a first emitting layer 122 on the third emitting layer 118 in the method of manufacturing the organic light-emitting display device 100 of FIG. 1. FIG. 5 is a cross-sectional view illustrating an operation of forming a second auxiliary layer 124 on the third emitting layer 118 in the method of manufacturing the organic light-emitting display device 100 of FIG. 1. FIG. 6 is a cross-sectional view illustrating an operation of forming a second emitting layer 126 on the third emitting layer 118 in the method of manufacturing the organic light-emitting display device 100 of FIG. 1. FIG. 7 is a cross-sectional view illustrating an operation of forming a second medium layer 130, a second electrode 132, and a passivation layer 134 on the second emitting layer 126 in the method of manufacturing the organic light-emitting display device 100 of FIG. 1. For simplicity, elements substantially identical to those of FIG. 1 are indicated by like reference numerals, and thus a redundant description thereof will be omitted.

Referring to FIGS. 2 through 7, the method of manufacturing the organic light-emitting display device 100 according to the current embodiment may include, for example, forming the first electrodes 112 on a plurality of areas (I, II, III) of the substrate 110, respectively, forming a plurality of emitting layers (118, 122, 126) and a plurality of auxiliary layers (120, 124) on the first electrodes 112, and forming the second electrode 132 on the emitting layers (118, 122, 126) and the auxiliary layers (120, 124). Here, for example, at least two of the emitting layers (118, 122, 126) may be formed by a deposition process, and all of the auxiliary layers (120, 124) may be formed by a transfer process. For example, the first emitting layer 122 and the first auxiliary layer 120 may be formed in a first area I by a transfer process, and the second auxiliary layer 124 may be formed in a second area II by a transfer process. The second emitting layer 126 and the third emitting layer 118 may be formed, for example, in the first area I, the second area II and a third area III by a deposition process.

First, referring to FIG. 2, the stacked structure of the substrate 110, the first electrodes 112 and the first medium layer 114 may be prepared. The first electrodes 112 and the first medium layer 114 may be formed by, for example, a general deposition process.

Referring to FIG. 3, after the preparation of the stacked structure, the third emitting layer 118 may be formed, for example, on the stacked structure. Here, the third emitting layer 118 may be formed by, for example, a deposition process using a mask 200. For example, the mask 200 (e.g., an open mask) having an opening may be aligned over the stacked structure, and a deposition source 300 may be placed to face a surface of the first medium layer 114. Then, the deposition source 300 may, for example, spray an organic material for forming the third emitting layer 118, thereby depositing the third emitting layer 118 on the surface of the first medium layer 114. That is, the third emitting layer 118 may be formed, for example, commonly to the first area I, the second area II, and the third area III.

Referring to FIG. 4, after the formation of the third emitting layer 118, the first auxiliary layer 120 and the first emitting layer 122 may be formed on the third emitting layer 118. The first auxiliary layer 120 and the first emitting layer 122 may be formed, for example, simultaneously by a transfer process using a first donor substrate 400.

Here, the first donor substrate 400 is a means of forming the first auxiliary layer 120 and the first emitting layer 122 and includes, for example, a first base film 410, a first light-to-heat conversion layer 412, and a first transfer layer 414.

The first base film 410 may be formed of transparent polymer, which includes, for example, polyester (such as polyethylene terephthalate), polyacryl, polyepoxy, polyethylene, polystyrene, and the like. For example, in an exemplary embodiment, the first base film 410 includes polyethylene terephthalate film. The first base film 410 should have optical properties and mechanical stability as a support film. The first base film 410 may have, for example, a thickness of about 10 to about 500 μm.

The first light-to-heat conversion layer 412 may be disposed on, for example, the first base film 410. The first light-to-heat conversion layer 412, for example, absorbs light in the infrared ray-visible ray range and converts some of the light into heat. To this end, the first light-to-heat conversion layer 412 should have optical density and includes a light absorbing material. The first light-to-heat conversion layer 412 may be, for example, a metal layer which contains aluminum oxide or aluminum sulfide as the light absorbing material or a polymer organic layer which contains carbon black, graphite or infrared dye as the light absorbing material. For example, if the first light-to-heat conversion layer 412 is the metal layer, it may be formed to a thickness of about 100 to about 5,000 Å by vacuum deposition, electron beam deposition or sputtering. For example, if the first light-to-heat conversion layer 412 is the polymer organic layer, it may be formed to a thickness of about 0.1 to about 10 μm by a general film coating method such as roll coating, gravure coating, extrusion coating, spin coating, or knife coating.

Although not shown in FIG. 4, a first intermediate layer may be formed, for example, on the first light-to-heat conversion layer 412. The first intermediate layer may prevent the light absorbing material (e.g., carbon black) of the first light-to-heat conversion layer 412 from contaminating the first transfer layer 414 formed in a subsequent process. The first intermediate layer may be formed of, for example, acrylic resin or alkyd resin. The first intermediate layer may be formed by, for example, a general coating process such as solvent coating and a curing process such as ultraviolet curing.

The first transfer layer 414 may be disposed on, for example, the first light-to-heat conversion layer 412 (or the first intermediate layer). The first transfer layer 414 may be formed as, for example, a double layer. That is, the first transfer layer 414 may include, for example, an upper transfer layer 414a and a lower transfer layer 414b. The upper transfer layer 414a may be formed of, for example, the same material as the first emitting layer 122, and the lower transfer layer 414b may be formed of, for example, the same material as the first auxiliary layer 120.

The first transfer layer 414 of the first donor substrate 400 may be, for example, aligned to face the third emitting layer 118, and then laser beams 600 may be irradiated to the first area I. If the laser beams 600 are irradiated to the first area I, light energy from the laser beams 600 may be converted into thermal energy by the first light-to-heat conversion layer 412 located in the first area I. The thermal energy may expand the first light-to-heat conversion layer 412 and, at the same time, may be delivered to the first transfer layer 414 thereby to transfer the first transfer layer 414 onto the third emitting layer 118. The first transfer layer 414, e.g., the upper transfer layer 414a and the lower transfer layer 414b transferred onto the third emitting layer 118 may become the first emitting layer 122 and the first auxiliary layer 120, respectively.

Referring to FIG. 5, after the formation of the first emitting layer 122 and the first auxiliary layer 120, the second auxiliary layer 124 may be formed, for example, on the third emitting layer 118. The second auxiliary layer 124 may be formed, for example, alone by a transfer process using a second donor substrate 500.

Here, the second donor substrate 500 is a means of forming the second auxiliary layer 124 and includes, for example, a second base film 510, a second light-to-heat conversion layer 512, and a second transfer layer 514. Although not shown in FIG. 5, a second intermediate layer may be interposed, for example, between the second light-to-heat conversion layer 512 and the second transfer layer 514.

The second base film 510 and the second light-to-heat conversion layer 512 respectively correspond to the first base film 410 and the first light-to-heat conversion layer 412, and thus a detailed description thereof will be omitted.

The second transfer layer 514 may be, for example, a single layer. The second transfer layer 514 may be formed of, for example, the same material as the second auxiliary layer 124.

The second transfer layer 514 of the second donor substrate 500 may be, for example, aligned to face the third emitting layer 118, and then laser beams 600 may be irradiated to the second area II. If the laser beams 600 are irradiated to the second area II, light energy from the laser beams 600 may be converted into thermal energy by the second light-to-heat conversion layer 512 located in the second area II. The thermal energy may expand the second light-to-heat conversion layer 512 and, at the same time, may be delivered to the second transfer layer 514 thereby to transfer the second transfer layer 514 onto the third emitting layer 118. The second transfer layer 514 transferred onto the third emitting layer 118 may become the second auxiliary layer 124.

Referring to FIG. 6, after the formation of the second auxiliary layer 124, the second emitting layer 126 may be formed, for example, on the first emitting layer 122, the second auxiliary layer 124, and the third emitting layer 118. Here, the second emitting layer 126 may be formed by, for example, a deposition process using a mask 200. For example, the mask 200 (e.g., an open mask) having an opening may be aligned over the first emitting layer 122, the second auxiliary layer 124 and the third emitting layer 118, and a deposition source 300 may be placed to face respective surfaces of the first emitting layer 122, the second auxiliary layer 124 and the third emitting layer 118. Then, the deposition source 300 may, for example, spray an organic material for forming the second emitting layer 126, thereby depositing the second emitting layer 126 on the respective surfaces of the first emitting layer 122, the second auxiliary layer 124 and the third emitting layer 118. That is, the second emitting layer 126 may be formed, for example, commonly to the first area I, the second area II, and the third area III. In addition, the second emitting layer 126 may be formed to, for example, completely overlap the third emitting layer 118.

In the above processes of FIGS. 3 through 6, the resonance cycle of light emitted from the first area I, the second area II, and the third area III may be controlled by adjusting thicknesses of the emitting layers (118, 122, 126) and the auxiliary layers (120, 124). That is, the thicknesses of the emitting layers (118, 122, 126) and the auxiliary layers (120, 124) may be adjusted such that, for example, red light is emitted from the first area I, green light is emitted from the second area II, and blue light is emitted from the third area III.

Referring to FIG. 7, after the formation of the second emitting layer 126, the second medium layer 130, the second electrode 132, and the passivation layer 134 may be, for example, stacked sequentially on the second emitting layer 126. The second medium layer 130, the second electrode 132, and the passivation layer 134 may be formed by, for example, a general deposition process.

The passivation layer 134 may contain, for example, an inorganic insulator such as silicon nitride (SiNx) and silicon oxide (SiOx) or an organic insulator. For example, the organic insulator of the second passivation layer 134 may include benzocyclobutene (BCB), acryl-based resin or a combination thereof.

In the method of manufacturing the organic light-emitting display device 100 according to the current embodiment, a high-resolution organic light-emitting display device 100 can be obtained by, for example, using a transfer process in the manufacture of the organic light-emitting display device 100. In addition, as only the first emitting layer 122 and the auxiliary layers (120, 124) are formed by a transfer process, a reduction in the life of the organic light-emitting display device 100 can be minimized. In particular, a reduction in the life of the second emitting layer 126 which emits green light can be prevented by forming the second emitting layer 126 which emits green light using, for example, a deposition process.

Furthermore, the emitting layers (118, 122, 126) and the auxiliary layers (120, 124) are formed using a donor substrate and an open mask, not an FMM. Therefore, process efficiency can be increased.

Figure 8:
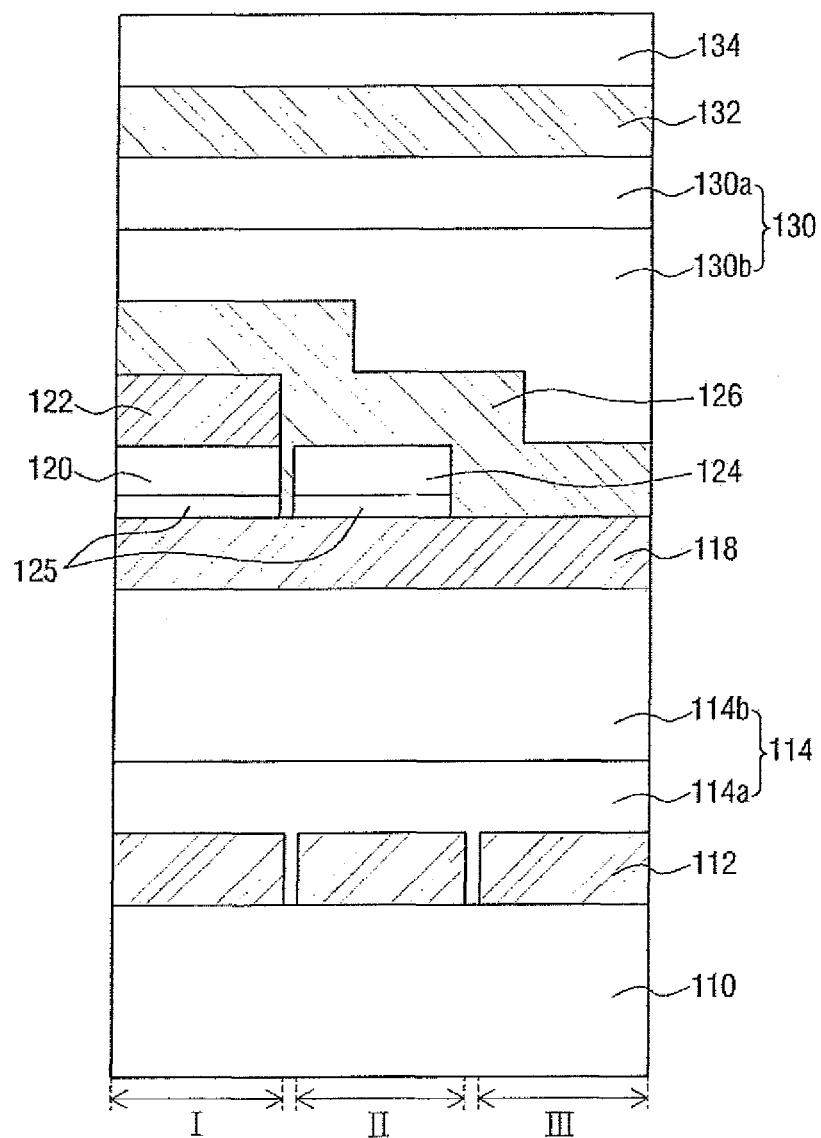
FIG. 8 is a schematic cross-sectional view of an organic light-emitting display device according to an embodiment of the present invention.

An organic light-emitting display device according to an embodiment of the present invention will now be described with reference to FIG. 8. FIG. 8 is a schematic cross-sectional view of an organic light-emitting display device 102 according to an embodiment of the present invention. For simplicity, elements substantially identical to those of the organic light-emitting display device 100 of FIG. 1 are indicated by like reference numerals, and thus a redundant description thereof will be omitted.

Referring to FIG. 8, a plurality of auxiliary layers (120, 124, 125) may further include, for example, a third auxiliary layer 125. The third auxiliary layer 125 may be disposed, for example, between a first auxiliary layer 120 and a third emitting layer 118 and/or between a second auxiliary layer 124 and the third emitting layer 118. In addition, the third emitting layer 118 may include, for example, a P-type dopant. In an embodiment, the third auxiliary layer 125 may include, for example, a P-type dopant only. In an embodiment, the third auxiliary layer 125 may be formed, for example, integrally with the first auxiliary layer 120 and/or the second auxiliary layer 124 in a region under the first auxiliary layer 120 and/or the second auxiliary layer 124, that is, a region that contacts the third emitting layer 118.

In the organic light-emitting display device 102 according to the current embodiment, as the third auxiliary layer 125 is added to the organic light-emitting display device 100 described in connection with FIG. 1, holes generated by first electrodes 112 can be delivered more easily to a first emitting layer 122 and a second emitting layer 126. Also, electrons generated by a second electrode 132 can be prevented from being delivered to the third emitting layer 118. Furthermore, the P-type dopant included in the third auxiliary layer 125 can reduce a driving voltage of the organic light-emitting display device 102.

Figure 9:
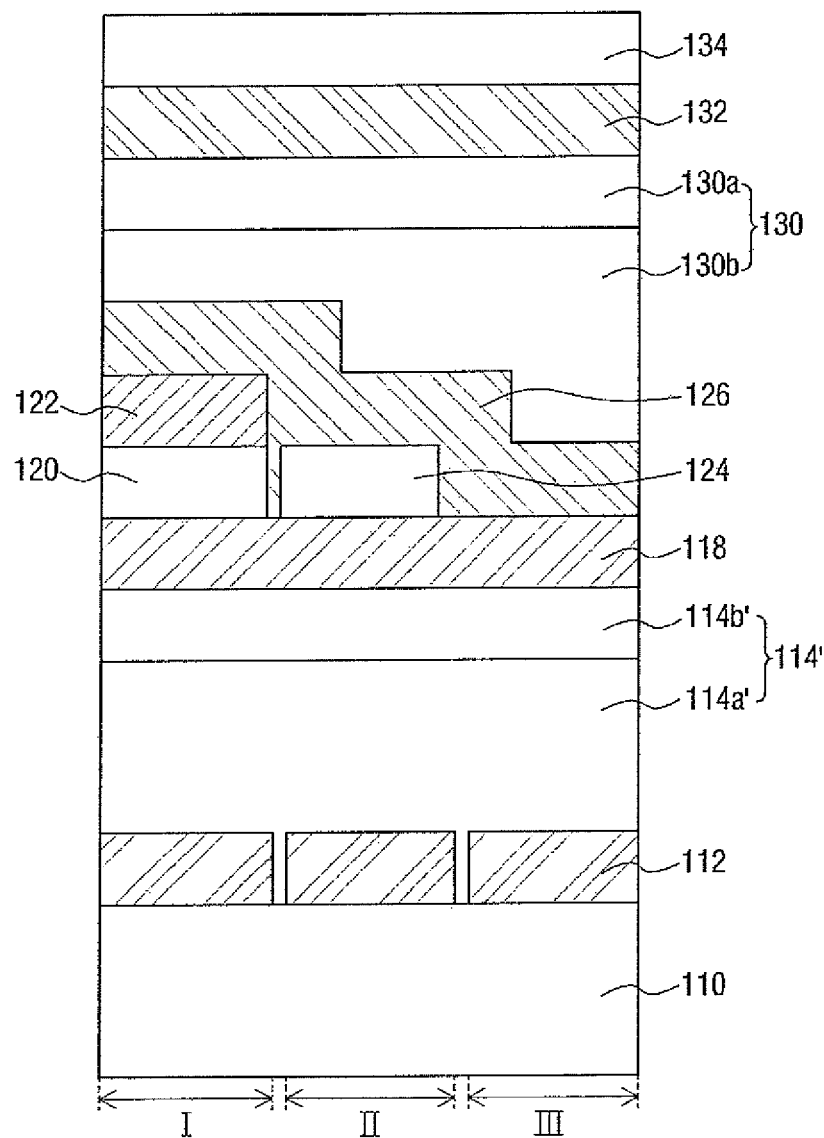
FIG. 9 is a schematic cross-sectional view of an organic light-emitting display device according to an embodiment of the present invention.

An organic light-emitting display device according to an embodiment of the present invention will now be described with reference to FIG. 9. FIG. 9 is a schematic cross-sectional view of an organic light-emitting display device 104 according to an embodiment of the present invention. For simplicity, elements substantially identical to those of the organic light-emitting display device 100 of FIG. 1 are indicated by like reference numerals, and thus a redundant description thereof will be omitted.

Referring to FIG. 9, a first medium layer 114' may include, for example, a hole injecting layer 114a' and a hole transport layer 114b'. The first medium layer 114' may include, for example, an inorganic material. Here, the inorganic material may be at least one of, for example, tungsten oxide and nickel oxide.

For example, the hole injecting layer 114a' may include an inorganic material. In an exemplary embodiment, the hole injecting layer 114a' may be formed of, for example, the inorganic material only. The hole injecting layer 114a' including the inorganic material may have a thickness of, for example, about 700 to about 1300 Å. For example, in an exemplary embodiment, the hole injecting layer 114a' including the inorganic material may have a thickness of 1000 Å. In addition, as the hole injecting layer 114a' becomes thicker, the hole transport layer 114b' may become relatively thinner. In an exemplary embodiment, the hole transport layer 114b' may have a thickness of, for example, about 100 to about 300 Å. For example, in an exemplary embodiment, the hole transport layer 114b' may have a thickness of about 200 Å.

Generally, an inorganic material such as tungsten oxide or nickel oxide is a non-conductor. However, if an inorganic layer is formed by thermal deposition of such an inorganic material, a space without oxygen atoms may be created inside the inorganic layer, and free electrons may be generated in the space. The free electrons may cause the inorganic layer to have conductivity higher than that of a general organic material.

Therefore, according to the current embodiment, a driving voltage of the organic light-emitting display device 104 can be reduced.

Figure 10:
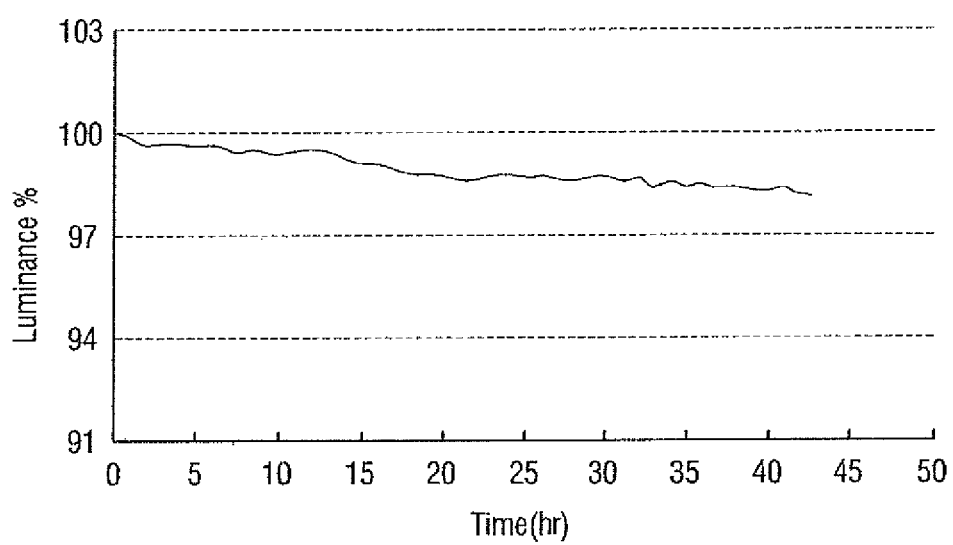
FIG. 10 is a graph illustrating a luminance reduction rate over time of an organic light-emitting display device manufactured according to Example 1.
Figure 11:
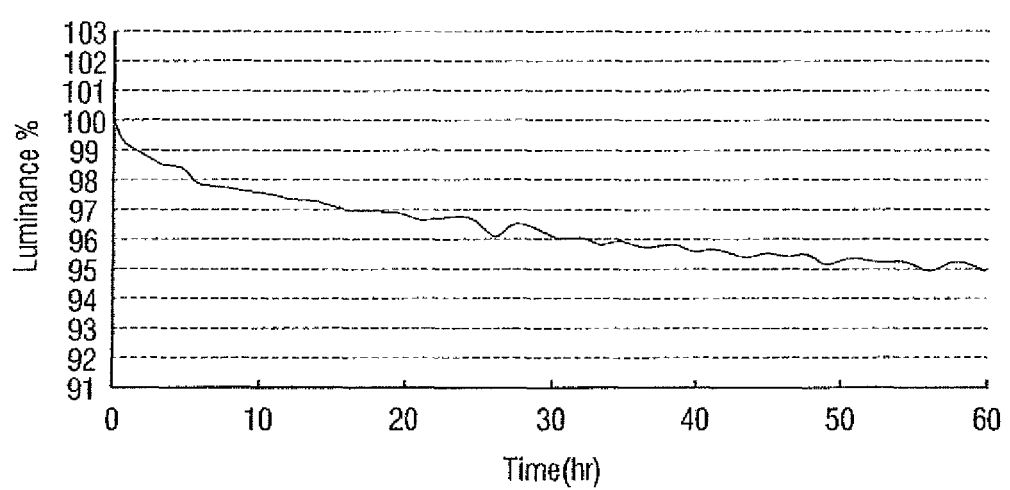
FIG. 11 is a graph illustrating a luminance reduction rate over time of an organic light-emitting display device manufactured according to Comparative Example 1.

An organic light-emitting display device 100 according to an embodiment of the present invention and a conventional organic light-emitting display device will hereinafter be compared with reference to FIGS. 10 and 11. FIG. 10 is a graph illustrating a luminance reduction rate over time of an organic light-emitting display device 100 manufactured according to Example 1. FIG. 11 is a graph illustrating a luminance reduction rate over time of an organic light-emitting display device manufactured according to Comparative Example 1.

Example 1

A plurality of first electrodes 112 were formed to a thickness of about 1000 Å by depositing indium tin oxide (ITO) on a substrate 110, which contains silicon oxide ($SiO_2$) as its main component, using a sputtering method.

A hole injecting layer 114a was formed to a thickness of about 100 Å by depositing tris(N-3-methylphenyl-N-phenylamino)triphenylamine (m-MTDATA) on the first electrodes 112.

A hole transport layer 114b was formed to a thickness of 1200 Å by depositing N,N'-Di-[(1-naphthyl)-N,N'-diphenyl]-1,1'-biphenyl)-4,4'-diamine (NPB) on the hole injecting layer 114a.

A third emitting layer 118, which contains 4,4'-(carbazole-9-yl)biphenyl (CBP) as a blue host material and $F_2Irpic$ as a blue dopant material, was deposited as a common layer on the hole injecting layer 114a by using an open mask. Here, the third emitting layer 118 was formed to a thickness of about 100 Å.

A first emitting layer 122 and a first auxiliary layer 120 were formed on the third emitting layer 118 in a first area I. The first emitting layer 122 and the first auxiliary layer 120 were formed by an LITI method using a first donor substrate 400. The first donor substrate 400 was formed by sequentially stacking a first light-to-heat conversion layer 412 formed of aluminum oxide, a first intermediate layer formed of acrylic resin, and a first transfer layer 414 on a first base film 410 formed of polyethylene terephthalate. Here, the first transfer layer 414 was composed of an upper transfer layer 414a formed of bis-(2-methyl-8-quinolinolate)-4-(phenylphenolate)aluminum and $Btp_2Ir(acac)$ and a lower transfer layer 414b formed of NPB. After the first donor substrate 400 was placed such that the first transfer layer 414 faced the third emitting layer 118 with a gap therebetween, laser beams 600 were irradiated to the first donor substrate 400, thereby forming the first emitting layer 122 and the first auxiliary layer 120. The first emitting layer 122 and the first auxiliary layer 120 were formed of the same materials as the upper transfer layer 414a and the lower transfer layer 414b, respectively. Here, the first emitting layer 122 was formed to a thickness of about 200 Å, and the first auxiliary layer 120 was formed to a thickness of about 900 Å.

A second auxiliary layer 124 was formed on the third emitting layer 118 in a second area II. The second auxiliary layer 124 was formed by an LITI method using a second donor substrate 500. The second donor substrate 500 was formed by sequentially stacking a second light-to-heat conversion layer 512 formed of aluminum oxide, a second intermediate layer formed of acrylic resin, and a second transfer layer 514 on a second base film 510 formed of polyethylene terephthalate. Here, the second transfer layer 514 was formed of NPB. After the second donor substrate 500 was placed such that the second transfer layer 514 faced the third emitting layer 118 with a gap therebetween, laser beams 600 were irradiated to the second donor substrate 500, thereby forming the second auxiliary layer 124. The second auxiliary layer 124 was formed of the same material as the second transfer layer 514. Here, the second auxiliary layer 124 was formed to a thickness of about 700 Å.

A second emitting layer 126 formed of 9,10-(2-dinaphthyl)anthracene (ADN) and $Ir(ppy)_2(acac)$ was deposited on the first emitting layer 122, the second auxiliary layer 124, and the third emitting layer 118 as a common layer by using an open mask. Here, the second emitting layer 126 was formed to a thickness of about 200 Å.

An electron transport layer 130b was formed to a thickness of about 300 Å by depositing tris(8-hydroxyquinolinato)aluminum (Alq3) on the second emitting layer 126.

An electron injecting layer 130a was formed to a thickness of about 13 Å by depositing LiF on the electron transport layer 130b.

A second electrode 132 was formed to a thickness of about 100 Å by depositing MgAg on the electron injecting layer 130a.

A passivation layer 134 was formed to a thickness of about 600 Å by depositing $SiO_2$ on the second electrode 132.

A graph illustrating a luminance reduction rate over time of the organic light-emitting display device 100 manufactured according to Example 1 is shown in FIG. 10. Specifically, the graph of FIG. 10 illustrates a luminance reduction rate over time of the second emitting layer 126 measured in a state where a driving voltage of the organic light-emitting display device 100 manufactured according to Example 1 was set to about 6 V and where efficiency was set to about 75 cd/A.

Comparative Example 1

An organic light-emitting display device was manufactured in the same way as in Example 1 except that a second emitting layer and a second auxiliary layer were simultaneously formed in a second area II by a transfer process.

A graph illustrating a luminance reduction rate over time of the organic light-emitting display device manufactured according to Comparative Example 1 is shown in FIG. 11. Specifically, the graph of FIG. 11 illustrates a luminance reduction rate over time of the second emitting layer measured in a state where a driving voltage of the organic light-emitting display device manufactured according to Comparative Example 1 was set to about 6 V and where efficiency was set to about 75 cd/A.

As apparent from the graphs of FIGS. 10 and 11, the organic light-emitting display device 100 manufactured according to Example 1 had a longer life than the organic light-emitting display device manufactured according to Comparative 1.

Embodiments of the present invention provide at least one of the following benefits.

That is, it is possible to extend the life of a high-resolution organic light-emitting display device.

In addition, a driving voltage of the organic light-emitting display device can be reduced.

Further, it is possible to increase process efficiency by minimizing the use of a fine metal mask.

However, the benefits of embodiments the present invention are not restricted to the ones set forth herein.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An organic light-emitting display device comprising:
a substrate comprising a plurality of areas including a first area, a second area, and a third area;
a plurality of first electrodes disposed on the areas of the substrate, respectively;
a second electrode disposed on the first electrodes; and
a plurality of emitting layers, including a first emitting layer, a second emitting layer, and a third emitting layer, disposed between the first electrodes and the second electrode,
wherein the first emitting layer is disposed exclusively within the first area,
wherein the third emitting layer has a substantially planar shape across the first, second, and third areas, and
wherein the second emitting layer is disposed within the first, second, and third areas.

2. The display device of claim 1, wherein the first emitting layer is disposed in direct contact with the second emitting layer and the first emitting layer is not in contact with the third emitting layer.

3. The display device of claim 2, wherein the first emitting layer is configured to emit red light, wherein the second emitting layer is configured to emit green light, and wherein the third emitting layer is configured to emit blue light.

4. The display device of claim 1, wherein the first emitting layer is disposed between the second emitting layer and the third emitting layer, wherein the second emitting layer is disposed between the first emitting layer and the second electrode, and wherein the third emitting layer is disposed between the first emitting layer and the first electrodes.

5. The display device of claim 3, wherein the second emitting layer has an electron transport capability, and the third emitting layer has a hole transport capability.

6. The display device of claim 1, further comprising a plurality of auxiliary layers disposed between the first electrodes and the second electrode, wherein the auxiliary layers are disposed between the second emitting layer and the third emitting layer.

7. The display device of claim 6, wherein the auxiliary layers comprise a first auxiliary layer and a second auxiliary layer, wherein the first auxiliary layer is disposed between the first emitting layer and the third emitting layer in the first area, and the second auxiliary layer is disposed between the second emitting layer and the third emitting layer in the second area.

8. The display device of claim 7, wherein the auxiliary layers further comprise a third auxiliary layer, wherein the third auxiliary layer is disposed between the first auxiliary layer and the third emitting layer and/or between the second auxiliary layer and the third emitting layer and wherein the third auxiliary layer comprises a P-type dopant.

9. The display device of claim 1, further comprising:
a first medium layer disposed between the first electrodes and the emitting layers and wherein the first medium layer is configured to inject or transport electrons or holes; and
a second medium layer disposed between the emitting layers and the second electrode and wherein the second medium layer is configured to inject or transport electrons or holes,
wherein at least one of the first medium layer and the second medium layer comprises an inorganic material.

10. The display device of claim 9, wherein the inorganic material comprises at least one of tungsten oxide and nickel oxide.

11. An organic light-emitting display device comprising:
a substrate comprising a first area, a second area, and a third area;
a first electrode disposed on the first, second, and third areas of the substrate;
a second electrode disposed on the first electrode;
a first auxiliary layer located in the first area; and
a plurality of emitting layers located in the first, second, and third areas and disposed between the first electrode and the second electrode,
wherein the emitting layers comprise:
a first emitting layer disposed exclusively within the first area, between the first auxiliary layer and the second electrode;
a second emitting layer disposed within the first, second, and third areas, between the first emitting layer and the second electrode; and
a third emitting layer having a substantially planar shape across the first, second, and third areas, and disposed between the first electrode and the first auxiliary layer.

12. The display device of claim 11, further comprising a second auxiliary layer located in the second area and disposed between the second emitting layer and the third emitting layer.

* * * * *